United States Patent
Nomoto et al.

(10) Patent No.: US 7,626,625 B2
(45) Date of Patent: Dec. 1, 2009

(54) SOLID-STATE IMAGING DEVICE AND CAMERA SYSTEM

(75) Inventors: Tetsuo Nomoto, Kanagawa (JP); Eiji Makino, Kanagawa (JP); Keiji Mabuchi, Kanagawa (JP); Tsutomu Haruta, Kanagawa (JP); Shinjiro Kameda, Kanagawa (JP)

(73) Assignee: Sony Corporation, Tokyo (JP)

( * ) Notice: Subject to any disclaimer, the term of this patent is extended or adjusted under 35 U.S.C. 154(b) by 514 days.

(21) Appl. No.: 10/571,720

(22) PCT Filed: Sep. 16, 2004

(86) PCT No.: PCT/JP2004/013552

§ 371 (c)(1),
(2), (4) Date: Mar. 13, 2006

(87) PCT Pub. No.: WO2005/027511

PCT Pub. Date: Mar. 24, 2005

(65) Prior Publication Data

US 2007/0024726 A1    Feb. 1, 2007

(30) Foreign Application Priority Data

Sep. 16, 2003    (JP) .............................. 2003-323408

(51) Int. Cl.
*H04N 3/14*    (2006.01)
*H04N 5/335*    (2006.01)
(52) U.S. Cl. .................. 348/308; 348/302; 348/294
(58) Field of Classification Search ......... 348/243–245, 348/294, 308; 250/208.1
See application file for complete search history.

(56) References Cited

U.S. PATENT DOCUMENTS 5,012,344 A    4/1991   Goto
5,288,988 A *  2/1994   Hashimoto et al. ........ 250/208.1
5,786,588 A *  7/1998   Takahashi ................. 250/208.1

(Continued)

FOREIGN PATENT DOCUMENTS

EP        1017231        7/2000

(Continued)

OTHER PUBLICATIONS

Machine Translation of JP 2003230055 A Nakamura, Nobuo☐☐Created on Oct. 29, 2008☐☐.*

(Continued)

*Primary Examiner*—Sinh Tran
*Assistant Examiner*—Jason Flohre
(74) *Attorney, Agent, or Firm*—Sonnenschein Nath & Rosenthal LLP (57) ABSTRACT

A solid state imaging device able to make noise from a non-selected row small, able to suppress occurrence of vertical stripes in a bright scene, not requiring charging including a floating node capacity via a reset transistor, able to prevent an increase of a driver size of a drain line, and able to secure high speed operation and a camera system using this as the imaging device are provided.

An MOS type solid state imaging device in which unit pixels 10 each having a photodiode 11, a transfer transistor 12 for transferring the signal of the photodiode 11 to a floating node N11, an amplifier transistor 13 for outputting the signal of the floating node N11 to a vertical signal line 22, and a reset transistor 14 for resetting the floating node N11 are arrayed in a matrix and in which a gate voltage of the reset transistor 14 is controlled by three values of a power source potential (for example 3V), a ground potential (0V), and a negative power source potential (for example −1V).

4 Claims, 8 Drawing Sheets

U.S. PATENT DOCUMENTS

| | | |
|---|---|---|
| 6,566,697 B1 | 5/2003 | Fox et al. |
| 6,690,000 B1 | 2/2004 | Muramatsu et al. |
| 6,873,034 B2 * | 3/2005 | Nakamura et al. .......... 257/680 |
| 6,956,606 B2 * | 10/2005 | Mabuchi ..................... 348/308 |
| 7,224,390 B2 * | 5/2007 | Kokubun et al. ............ 348/308 |
| 2002/0109160 A1 | 8/2002 | Mabuchi et al. |
| 2003/0025817 A1 | 2/2003 | Yonemoto et al. |
| 2003/0112350 A1 | 6/2003 | Suzuki et al. |
| 2004/0252211 A1 * | 12/2004 | Rhodes ....................... 348/308 |

FOREIGN PATENT DOCUMENTS

| | | |
|---|---|---|
| JP | 7-95829 | 10/1995 |
| JP | 7-95829 | 11/1995 |
| JP | 2000-092392 | 3/2000 |
| JP | 2000092392 A * | 3/2000 |
| JP | 2000-175107 | 6/2000 |
| JP | 2000-209508 | 7/2000 |
| JP | 2000-244818 | 9/2000 |
| JP | 2002-237584 | 8/2002 |
| JP | 2003-230055 | 8/2003 |
| JP | 2003-234959 | 8/2003 |
| JP | 2003230055 A * | 8/2003 |

OTHER PUBLICATIONS

Machine translation of JP 2000092392 A Mabuchi, Keiji☐☐Created on Oct. 27, 2008.*

Japanese Office Action issued on Jan. 9, 2007.

European Search Report issued on May 8, 2009 in connection with related European Patent Application No. 04773198.9.

* cited by examiner

SOLID-STATE IMAGING DEVICE AND CAMERA SYSTEM

TECHNICAL FIELD

The present invention relates to a solid state imaging device and a camera system, more particularly relates to an X-Y address type solid state imaging device such as an MOS type solid state imaging device and a camera system using this as the imaging device.

BACKGROUND ART

As an X-Y address type solid state imaging device, for example, an MOS type solid state imaging device, one configured by unit pixels comprised of three transistors and having a large number of these unit pixels arrayed in a matrix is known.

Figure 1:
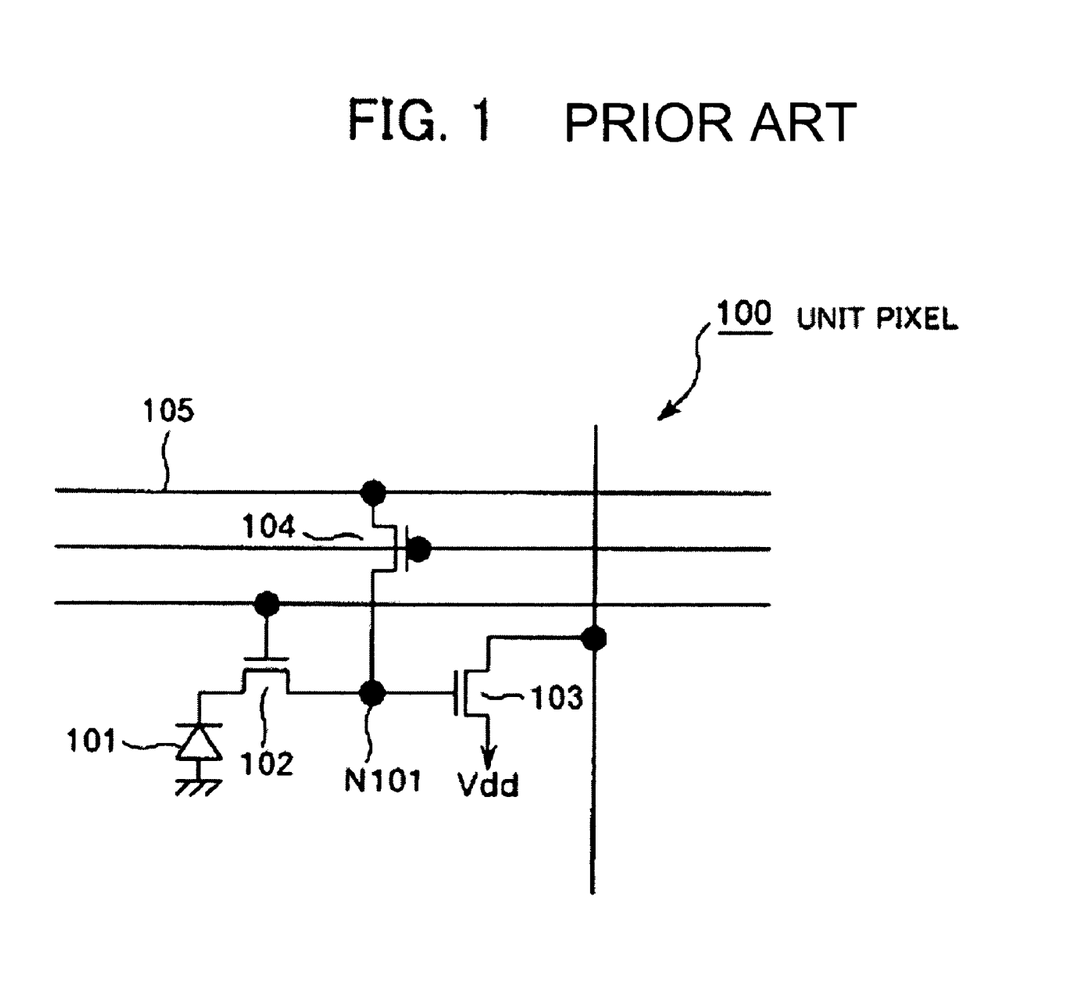
[FIG. 1] A view of the configuration of a unit pixel for explaining a problem of the prior art.

The configuration of the unit pixel in this case is shown in FIG. 1. As apparent from the figure, a unit pixel 100 has a photodiode (PD) 101, a transfer transistor 102, an amplifier transistor 103, and a reset transistor 104.

In the MOS type solid state imaging device employing the above pixel configuration, during the period in which the row is not selected, the potential of a floating node N101 is reduced to a low level (hereinafter described as the "L level") from a drain line 105 through the reset transistor 104. When the row is selected, an operation for raising the potential of the floating node N101 to a high level (hereinafter described as the "H level") is carried out.

In such an MOS type solid state imaging device, as the reset transistor 104, use is made of a depression type transistor. This is employed so as to make the drain voltage serving as a power supply of the pixel portion and the potential of the floating node N101 match without variation when the reset transistor 104 is on.

Accordingly, the floating node potential when the reset transistor 104 is on matches with the potential level of the drain line. As the potential level of the drain line, specifically, for example as described in Patent Document 1, the H level is a power source potential VDD, and the L level becomes 0.4 to 0.7V (the L level may be 0V as well).

Here, consider the potential of the floating node for a selected row and a nonselected row.

First, consider the operation of a selected row.

After the drain line is set at the H level, the reset transistor and the transfer transistor are sequentially turned off→on→off and a reset phase potential and a data phase potential are output. A difference of these signals is output as a light signal via a correlated double sampling (CDS) circuit.

At the time of acquisition of the data phase potential, when the charge of the photodiode is transferred to the floating node, the floating node potential is lowered.

Next, consider the nonselected row.

Both of the reset transistor and the transfer transistor remain in the off state as they are. Only the drain line repeats values of H level and L level.

Patent Document 1: Japanese Patent Publication No. 2002-51263

DISCLOSURE OF THE INVENTION

Problem to be Solved by the Invention

In a past MOS type solid state imaging device, however, since the reset transistor employs a depression structure, even when a reset transistor is in the off state (nonselected row), leakage current causes the floating node potential to rise (the floating node potential is about 1V when a threshold voltage Vth is −1V).

On the other hand, in a selected row, the floating node potential of the data phase becomes low in comparison with the potential of the floating node potential of the reset phase. When the amount of light is particularly large, the voltage greatly changes (falls), and the potential difference from the floating node in the nonselected row becomes small.

As a result, the potential signal from a selected row to be set at a high potential with respect to a nonselected row is read, but this potential difference becomes unclear. Therefore, there was the problem that noise from the nonselected row became large and consequently vertical stripes occurred in a bright scene.

Further, similarly due to the employment of the depression structure by the reset transistor, the influence of the capacity component of the floating node is visible from a drive circuit of the drain interconnect via the reset transistor. When the drain interconnect is commonly connected to all pixels, it becomes necessary to charge not only the drain interconnect capacity of all pixels, but also the floating node capacity via the reset transistor, so a problem arises from the point of view of the driver size of the drain line and from the point of view of the high speed property.

An object of the present invention is to provide a solid state imaging device able to make the noise from a nonselected row small, able to suppress the occurrence of vertical stripes in a bright scene, not needing charging including the floating node capacity via a reset transistor, able to prevent an increase of the driver size of the drain line, and able to secure high speed operation and a camera system using this as an imaging device.

Means for Solving the Subject

To achieve the above object, a solid state imaging device of a first aspect of the present invention has a plurality of unit pixels formed in an imaging area, wherein each unit pixel has a photoelectric converter for generating a charge in accordance with an amount of incident light, a transfer transistor for transferring a signal of the photoelectric converter to a floating node, an amplifier transistor for outputting a signal of the floating node to a signal line, and a reset transistor for resetting the floating node, at least one of a plurality of potentials supplied to a gate electrode of the reset transistor being a negative potential.

A solid state imaging device of a second aspect of the present invention has a plurality of unit pixels formed in an imaging area, wherein the unit pixel has a photoelectric converter for generating a charge in accordance with an amount of incident light, a transfer transistor for transferring a signal of the photoelectric converter to a floating node, an amplifier transistor for outputting a signal of the floating node to a signal line, a reset transistor for resetting the floating node, and a portion able to supply three or more types of potentials to the gate electrode of the reset transistor.

Preferably, the voltage of at least one type of potential among at least three or more types of potentials supplied to the gate electrode of the reset transistor is a negative potential.

Preferably, provision is made of a portion able to set the gate potential when bringing the reset transistor from an ON state to an OFF state at a negative power source potential after passing a ground level power source potential from a positive high level power source potential.

Further, preferably, at both timings of sampling and holding a precharge phase and a data phase, the gate potential of the reset transistor is set at the ground potential.

Further, preferably, in a period during which the gate potential of the reset transistor of the selected pixel is set at the ground potential, the gate potential of the reset transistor of the nonselected pixel is a negative potential.

Preferably, provision is made of a chip (not shown) for processing the signal output through the signal line.

A camera system according to a third aspect of the present invention has a solid state imaging device with a unit pixel having a photoelectric converter for generating a charge in accordance with an amount of incident light, a transfer transistor for transferring a signal of the photoelectric converter to a floating node, an amplifier transistor for outputting a signal of the floating node to a signal line, and a reset transistor for resetting the floating node, at least one of a plurality of potentials supplied to a gate electrode of the reset transistor being a negative potential; an optical system for guiding incident light to an imaging portion of the solid state imaging device; and a signal processing circuit for processing an output signal of the solid state imaging device.

A camera system according to a fourth aspect of the present invention has a solid state imaging device with a unit pixel having a photoelectric converter for generating a charge in accordance with an amount of incident light, a transfer transistor for transferring a signal of the photoelectric converter to a floating node, an amplifier transistor for outputting a signal of the floating node to a signal line, a reset transistor for resetting the floating node, and a portion able to supply three or more types of potentials to the gate electrode of the reset transistor; an optical system for guiding an incident light to an imaging portion of the solid state imaging device; and a signal processing circuit for processing an output signal of the solid state imaging device.

According to the present invention, a negative potential is applied to the gate electrode of the reset transistor at the time of nonselection. Due to this, a rising time of the common drain power supply is no longer affected by the floating node capacity via the depression type reset transistor.

Further, according to the present invention, the gate voltage of the reset transistor is controlled by three values of a power source potential, a ground potential, and a negative power source potential.

For example, instead of directly changing the gate potential from the power source potential to the negative power source potential, the voltage of the gate electrode when turning the reset transistor on→off is once held at the ground potential from the power source potential, the ground potential is charged/discharged once, then the potential is set at the negative power source potential.

Effect of the Invention

According to the present invention, the noise from the nonselected row can be made small, and the occurrence of vertical stripes in a bright scene can be suppressed.

Further, there are the advantages that there is no need for charging including also the floating node capacity via the reset transistor, the increase of the driver size of the drain line can be prevented, and high speed operation can be secured.

DESCRIPTION OF NOTATIONS

10 . . . unit pixel, 11 . . . photodiode, 12 . . . transfer transistor, 13 . . . amplifier transistor, 14 . . . reset transistor, 22 . . . vertical signal line, 23 . . . drain line, 24 . . . reset line, 25 . . . V-shift register, 26 . . . P-type MOS transistor, 31 . . . sample & hold/CDS circuit, 32 . . . horizontal signal line, 34 . . . H shift register, 40 . . . camera system, 41 . . . imaging device, 42 . . . lens, 43 . . . drive circuit, 100 . . . unit pixel, 101 photodiode, 102 . . . transistor, 103 . . . amplifier transistor, 104 . . . reset transistor, 105 . . . drain line, N101 . . . floating node.

BEST MODE FOR WORKING OUT THE INVENTION

Below, an embodiment of the present invention will be explained in detail with reference to the drawings.

Figure 2:
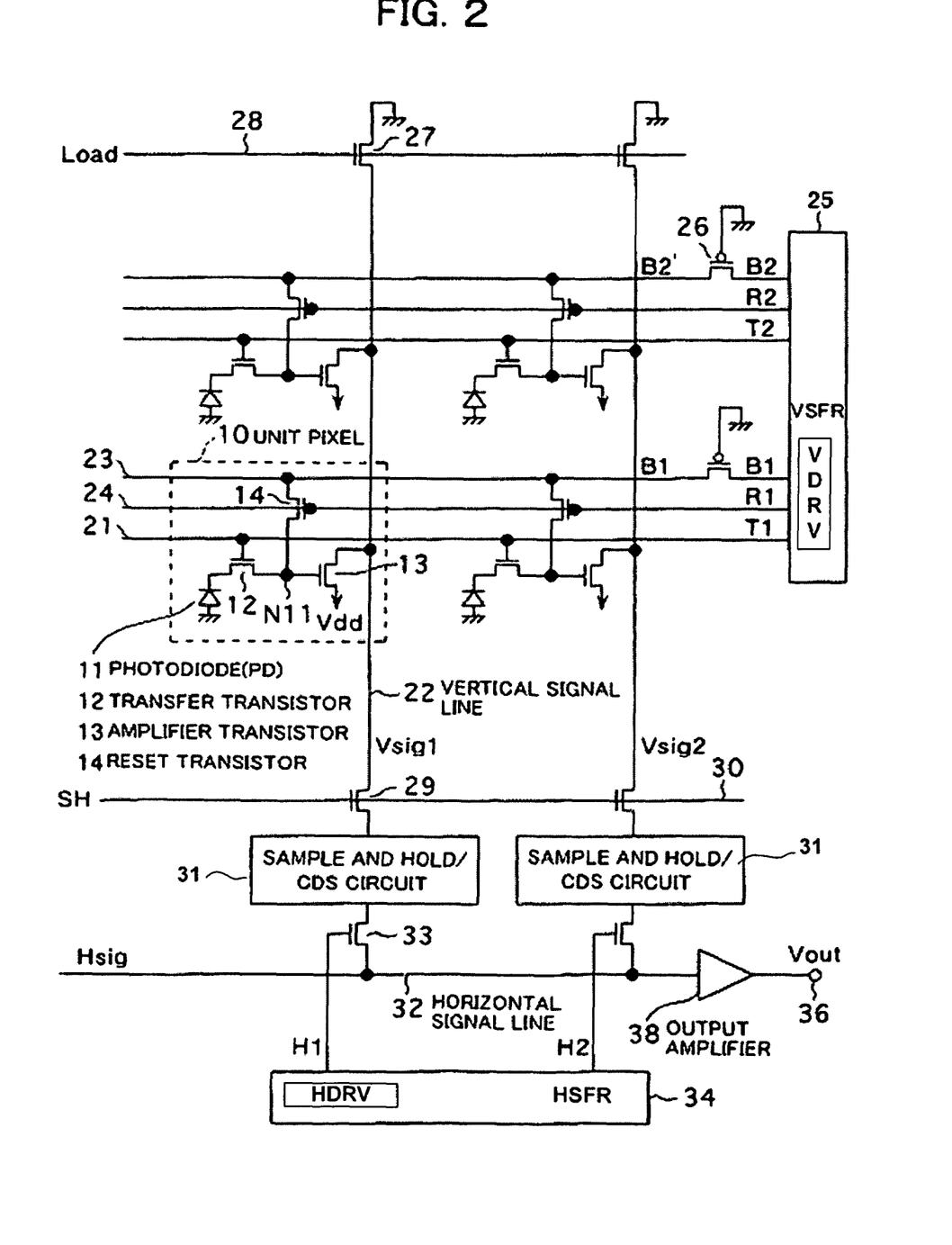
[FIG. 2] A circuit diagram showing an example of the configuration of an MOS type solid state imaging device according to an embodiment of the present invention.

FIG. 2 is a circuit diagram showing an example of the configuration of an MOS type solid state imaging device according to an embodiment of the present invention. Note that, in the MOS type solid state imaging device, a large number of unit pixels are arrayed in a matrix, but here, for simplification of the drawing, a pixel array comprised of two rows and two columns is drawn.

In FIG. 2, a unit pixel 10 has a three-transistor configuration having three N-type MOS transistors including a transfer transistor 12, an amplifier transistor 13, and a reset transistor 14 other than for example a photodiode 11 forming a photoelectric converter.

In this pixel structure, the photodiode 11 converts the incident light to a signal charge (for example electrons) having a charge in accordance with the amount of light and stores the charge.

The transfer transistor 12 is connected between a cathode of the photodiode 11 and a floating node N11, is connected at its gate to a vertical selection line 21, and has a function of transferring a signal charge stored in the photodiode 11 to the floating node N11 by conduction (ON).

The amplifier transistor 13 is connected between a vertical signal line 22 and the power supply Vdd, is connected at its gate to the floating node N11, and has a function of outputting the potential of the floating node N11 to the vertical signal line 22.

The reset transistor 14 is connected at its drain (one main electrode) to the drain line (interconnect) 23, is connected at its source (other main electrode) to the floating node N11, is connected at its gate to the reset line 24, and has a function of resetting the potential of the floating node N11.

In the pixel area (imaging area) comprised by these unit pixels 10 arrayed in a matrix, three lines including the vertical selection line 21, the drain line 23, and the reset line 24 are laid in a horizontal (H) direction (left/right direction in the figure) for each row of the pixel array, and the vertical signal line 22 is laid in a vertical (V) direction (up/down direction in the figure) for each column.

Further, the vertical selection line 21, the drain line 23, and the reset line 24 are driven by a V-shift register (VSFR) 25 configuring a vertical drive circuit (VDRV).

The vertical selection line 21 and the reset line 24 are directly connected to output ends of the V-shift register 25 for outputting a vertical selection pulse T and a reset pulse R for each row. The drain line 23 is connected to a reset voltage output end of the V-shift register 25 via a P-type MOS transistor 26 for each row. The gate of the P-type MOS transistor is grounded.

In the present embodiment, by driving the reset transistor 14 by three values (or four values or more) through the drain line 23, the V-shift register 25 provides a potential difference between potentials of the floating nodes N11 in the selected row and the nonselected row and clarifies the operations in the two selected row and nonselected row.

For example, in the present embodiment, one of the potentials supplied to the gate electrode of the reset transistor 14 is at least the negative potential.

Further, for example, the V-shift register 25 supplies a voltage of at least one type of potential among at least three types of potentials supplied to the gate electrode of the reset transistor 14 as the negative potential.

Further, the V-shift register 25 can set the gate potential when changing the reset transistor 14 from the ON state to the OFF state at the negative power source potential after passing through the ground level power source potential from the positive high level power source potential.

Further, in the present embodiment, at both timings of sampling and holding of the precharge phase and the data phase, the gate potential of the reset transistor 14 is set at the ground potential.

Further, the V-shift register 25 makes the gate potential of the reset transistor 14 in the nonselected pixel at the negative potential in the period during which the gate potential of the reset transistor 14 in the selected pixel is set at the ground potential.

The drive operation of this reset transistor 14 will be explained in further detail later.

At one side of the vertical direction (up/down direction in the figure) of the pixel area, for each column, a load transistor 27 configured by an N-type MOS transistor is connected between one end of the vertical signal line 22 and the ground. This load transistor 27 functions as a constant current source when connected at its gate to a load line 28.

On the other side of the vertical direction of the pixel area, one end (one main electrode) of a sample and hold (SH) switch 29 configured by the N-type MOS transistor is connected to the other end of the vertical signal line 22. A control end (gate) of this sample and hold switch 29 is connected to an SH line 30.

The other end (other main electrode) of the sample and hold switch 29 has an input end of a sample and hold (SH)/CDS (correlated double sampling) circuit 31 connected to it.

The sample and hold/CDS circuit 31 is a circuit for sampling and holding a potential Vsig of the vertical signal line 22 and performing the correlated double sampling (CDS).

Here, the "correlated double sampling" means processing for sampling two voltage signals input in time sequence and outputting a difference thereof.

A horizontal selection switch 33 configured by an N-type MOS transistor is connected between the output end of the sample and hold/CDS circuit 31 and a horizontal signal line 32.

The control end (gate) of this horizontal selection switch 33 receives horizontal scanning pulses H (H1, H2, . . . ) sequentially output at the time of the horizontal scanning from the H shift register (HSFR) 34 configuring the horizontal drive circuit (HDRV).

By the horizontal scanning pulses H being given and the turning on of the horizontal selection switch 33, the signal correlated double sampled (CDS) at the sample and hold/CDS circuit 31 is read out through the horizontal selection switch 33 to the horizontal signal line 32.

This read signal Hsig is derived from an output terminal 36 as an output signal Vout through an output amplifier 38 connected to one end of the horizontal signal line 32.

Below, an explanation will be given of several methods of setting the drive potential (gate potential) of the reset transistor 14 in the present embodiment and their effects including a comparison with a conventional circuit.

(Setting Method 1)

In this method, by making it possible to apply a negative potential to the gate electrode of the reset transistor 14 at the time of nonselection, the conventional problems can be solved.

Figure 3:
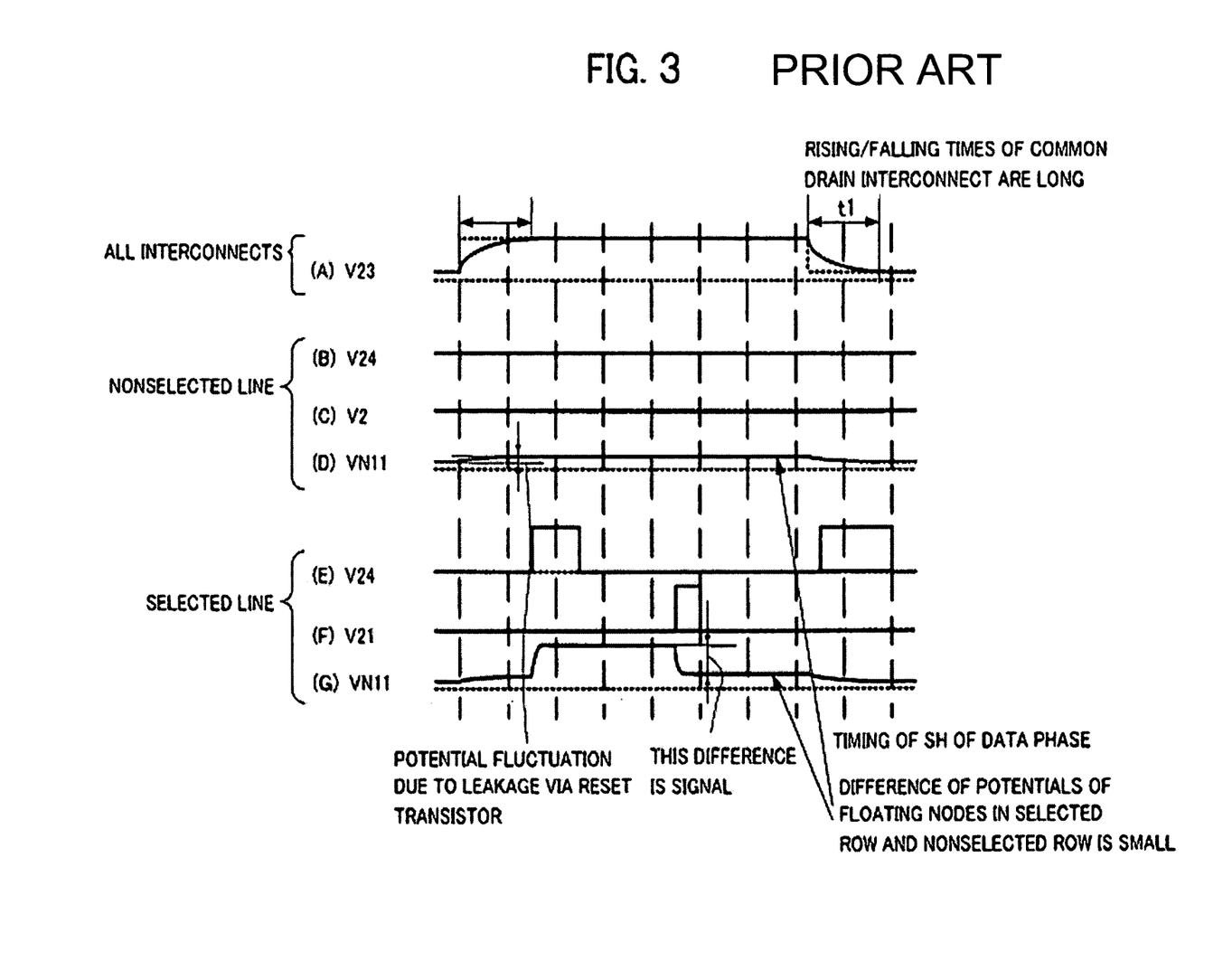
[FIG. 3] A diagram showing gate potentials of reset transistors and gate potentials of transfer transistors in a selected row and a nonselected row, a common drain power source potential, and a floating node potential in a case of operation by a gate voltage of a reset transistor of VRST+ (plus side).
Figure 4:
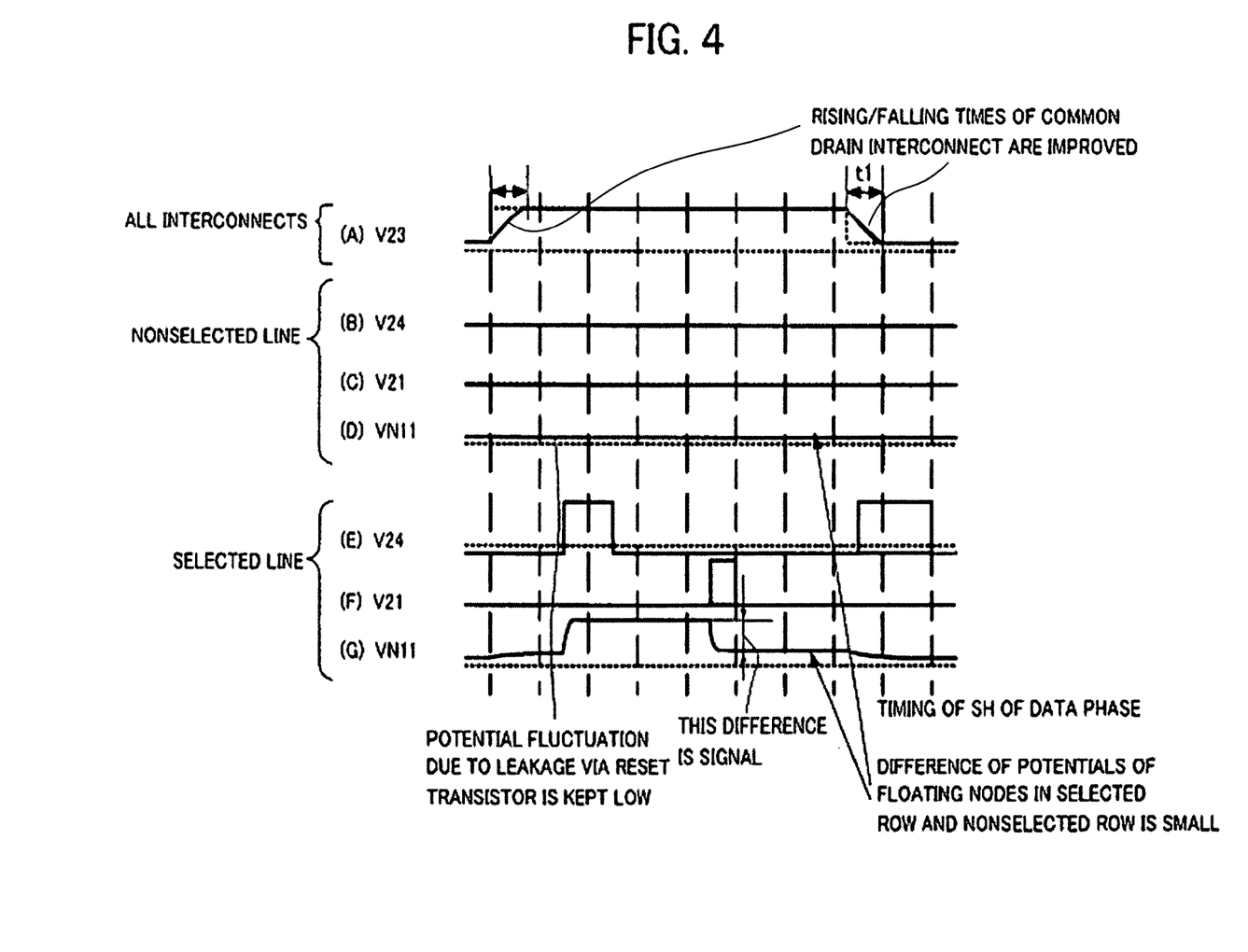
[FIG. 4] A diagram showing gate potentials of reset transistors and gate potentials of transfer transistors in a selected row and a nonselected row, a common drain power source potential, and a floating node potential in a case of operation by a gate voltage of a reset transistor of two values of VRST+ (plus side) and VRST− (minus side).

FIGS. 3(A) to 3(G) and FIGS. 4(A) to 4(G) are diagrams indicating gate potentials (RST lines) V24 of the reset transistors and gate potentials (TR lines) V21 of the transfer transistors 12 in the selected row and the nonselected row, a common drain power source potential V23, and a floating node potential VN11 in the case of operation by two values of the gate voltage of the reset transistor of VRST+ (plus side) and VRST− (minus side).

FIGS. 3(A) to 3(G) show the case of operation by a gate voltage of the reset transistor of VRST+ (plus side), while FIGS. 4(A) to 4(G) show the case of operation by a gate voltage of the reset transistor of VRST− (minus side) according to the present embodiment.

Further, in the diagrams, for comparison, the floating node potential in a two-value operation as in the past (gate voltage of reset transistor of VRST+ (plus side) and VRST0 (zero potential)) is shown together.

In the past circuit, as shown in FIGS. 3(A) to 3(G), the rising time t1 of the common drain power supply was influenced by the floating node capacity via the depression type reset transistor 14 and became long.

According to the method according to the present embodiment, however, as shown in FIGS. 4(A) to 4(G), even in the case where the depression type reset transistor 14 is used, the electric connection via the reset transistor 14 is kept small.

For this reason, the rising time t1 of the common drain power supply becomes short. Alternatively, the size of the driver of the drain power supply becomes small. Due to this, a high speed operation and reduction of chip size can be achieved.

Further, in the past circuit, as shown in FIGS. 3(A) to 3(G), due to the influence of leakage via the depression type reset transistor, the floating node potential in the nonselected row rose in the sampling time of the data phase due to the influence of the drain power supply and acted in a direction making the potential difference between the selected row and the nonselected row smaller.

According to the method according to the present embodiment, however, as shown in FIGS. 4(A) to 4(G), electric coupling via the depression type reset transistor 14 is suppressed, therefore the floating node potential in the nonselected row does not fluctuate (rise) along with the potential of the common drain line.

Accordingly, at the timing of the sampling of the data phase, the difference of the floating node potentials of the selected row and the nonselected row can be clarified.

As a result of this, the occurrence of saturated vertical stripes can be suppressed even when the amount of light is large.

(Setting Method 2)

In this method, by mounting a function of controlling the gate voltage of the reset transistor 14 to the three values of the power source potential (for example 3V), the ground potential (0V), and the negative power source potential (for example −1V), the conventional problems can be solved.

As previously explained, in an MOS type solid state imaging device, depression type transistors are used as the reset transistors. Due to this, there is the merit that the reset variation can be reduced when the reset transistors are on.

On the other hand, first, the difference of the floating node potentials in the nonselected row and the selected row no longer becomes clear and, second, there are the problems of increased speed and greater chip size from the position of the common drain power supply.

Therefore, in the present embodiment, the L level potential of the reset transistor in the nonselected row is set at the negative potential.

In order to supply the negative potential to the MOS type solid state imaging device, two types of methods including a method of supplying a negative potential from an external power source and a method of generating a negative potential in an internal circuit can be considered.

In comparison with the amplitude of the gate of the conventional reset transistor (amplitudes of the power source potential and the ground potential), when using a negative potential according to the above method, the amplitude thereof becomes large, therefore the amount of the charging and discharging of the circuit is large, so there is an apprehension that a load will be applied to each potential generation circuit (or power supply).

Further, for this reason, in the case of a circuit internally generating a negative potential, it is necessary to make the charge supply capability larger by exactly the amount of the amplitude. For this reason, the chip size increases.

Particularly, in the case of a negative power supply generated in the internal circuit, circuit noise is superimposed on the generated potential. The destination of the negative power source potential, that is, the gate of the reset transistor 14, is capacity coupled with the floating node N11. Therefore, the fluctuation of the negative power source potential appears as sensor noise as it is.

In order to solve these problems, in the present embodiment, the function of controlling the gate voltage of the reset transistor 14 by three values including the power source potential (for example 3V), the ground potential (0V), and the negative power source potential (for example −1V) is mounted.

For example, as shown in FIGS. 5(A) to 5(G), for the problem of the charge supply capability, it is possible to drive the gate potential of the reset transistor 14 by three values so as to reduce the load of the negative power supply generation circuit.

Hitherto, the voltage of the gate electrode when turning the reset transistor on→off was used to directly change the gate potential from the power source potential to the negative power source potential.

Figure 5:
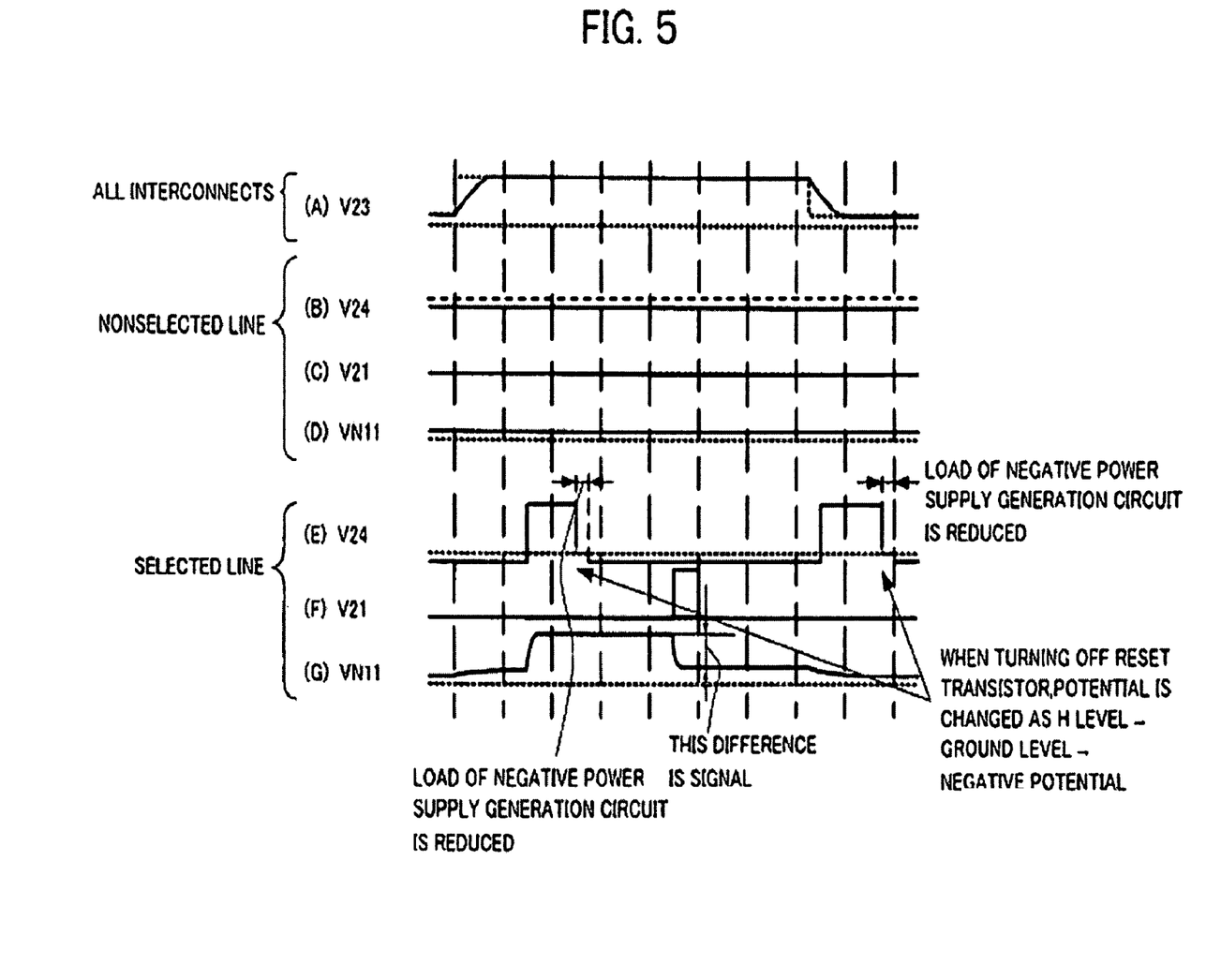
[FIG. 5] A diagram for explaining a method for driving the gate voltage of a reset transistor by three values.

By making the three-value drive function according to the present embodiment possible, it is possible to mount the function of holding the voltage at the ground potential from the power source potential, charging and discharging to the ground potential, and then setting the potential at the negative power source potential so as to solve the previous problems.

Simply, when the power supply voltage is 3V, the ground potential is 0V, and the negative power source potential is −1V, the following effects can be obtained.

When the voltage directly changes from the power source potential to the negative power source potential as in the past case, if making the circuit capacity C[F], the amount of charging/discharging becomes $Q=C(V1-V2)=4C$, and a load of 4C is generated in the negative power supply generation circuit.

On the other hand, when once going through the ground potential, the potential difference required for draining the negative power supply generation circuit is 1V, therefore the amount of charging/discharging becomes 1C, and the load is reduced to ¼ of the load in the past method.

Further, in the case of the negative power supply generated by an internal circuit, the circuit noise is superimposed on the generated potential. The destination of the negative power source potential, that is, the gate of the reset transistor 14, is capacity coupled with the floating node N11, therefore the fluctuation of the negative power source potential appears as sensor noise as it is.

With respect to fluctuation of the negative power source potential generated in an internal circuit, the potential fluctuation of the ground potential is small.

By utilizing this, for example, as shown in FIGS. 6(A) to 6(G), in the selected row, the gate electrode potential of the reset transistor is fixed to the ground potential in the timing period of the sampling and holding of the precharge phase and the data phase in the selected row (the gate potential of the reset transistor in the nonselected row is typically fixed to the negative potential).

Figure 6:
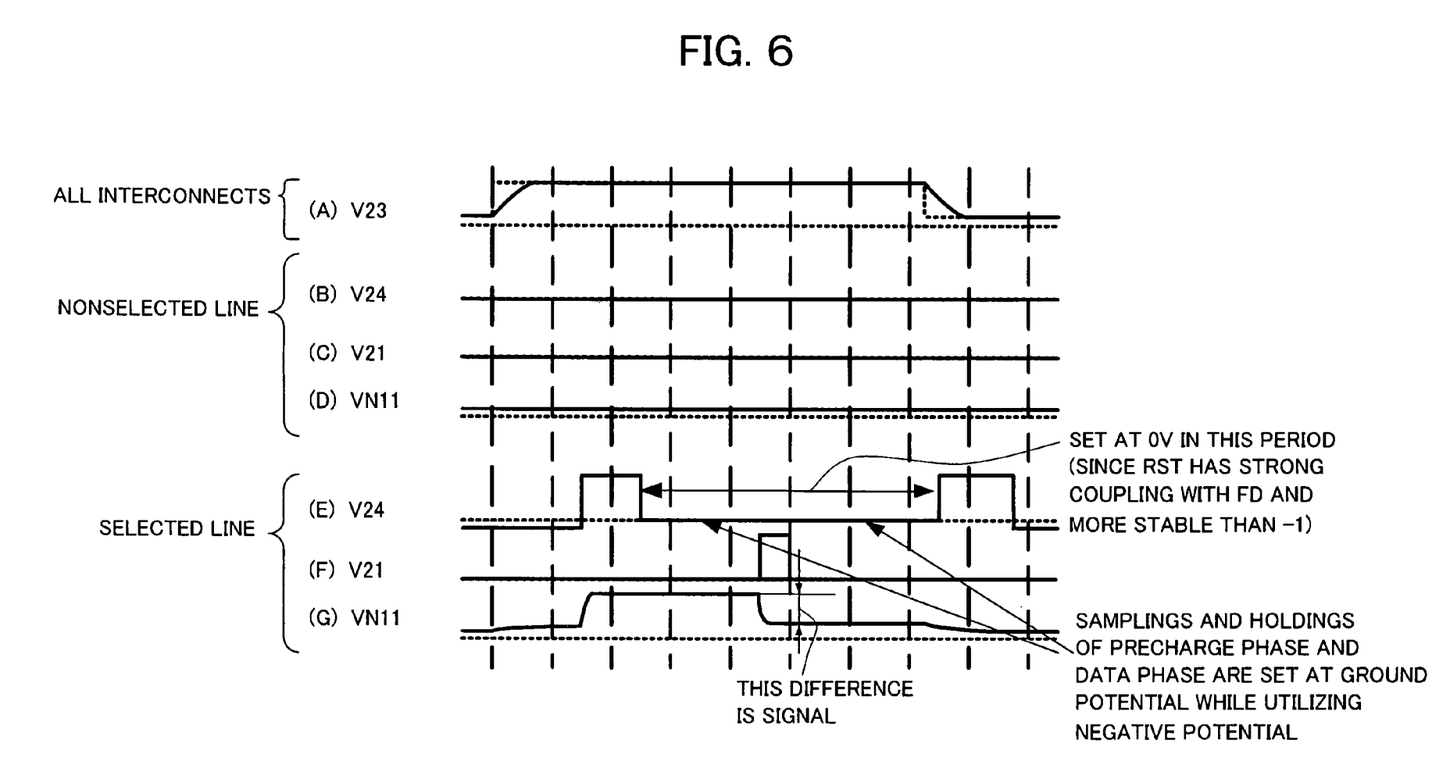
[FIG. 6] A diagram for explaining the method for driving the gate voltage of a reset transistor by three values and a diagram for explaining a method for setting sampling and holding of a precharge phase and a data phase at the ground potential while utilizing a negative potential.
Figure 7:
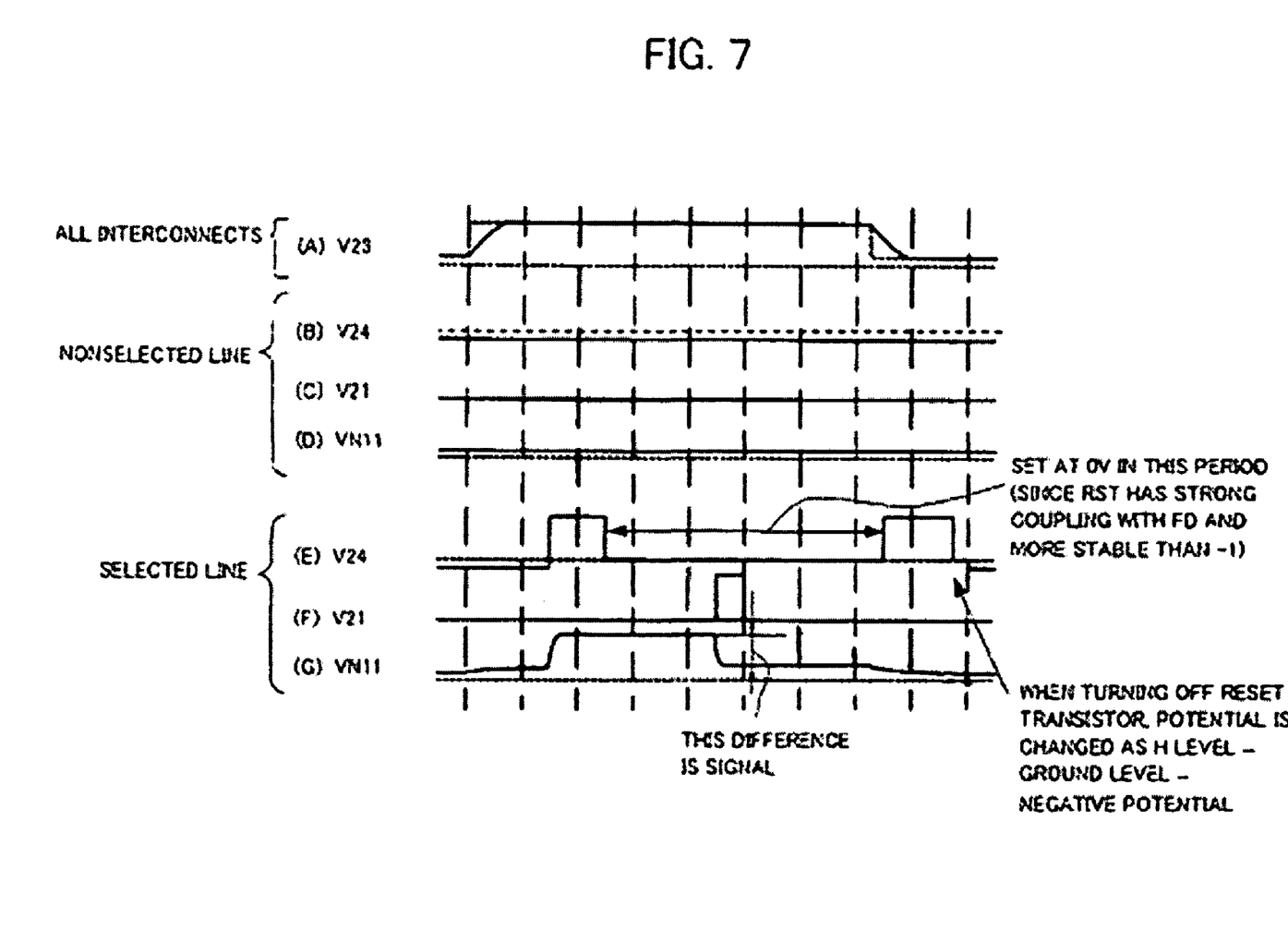
[FIG. 7] A diagram for explaining a method combining a method of setting the potential of a reset transistor at a negative potential through the ground level when turning off the reset transistor and a method of setting the timing of sampling and holding at the ground level.

Due to this, the number of times of change to the negative potential becomes small, therefore, not only is the supply load of the negative charge reduced, but also the effect of noise due to fluctuation of the capacity coupling property of the floating node potential due to the fluctuation of the potential of the negative power supply generation circuit is suppressed.

Further, by setting the reset gate at 0V in the selected row and setting the reset gate at the negative potential in the nonselected row, a significant difference is reliably added to the floating node potentials in the selected row and the nonselected row, therefore vertical stripes can be prevented even in a bright scene.

Furthermore, for example as shown in FIGS. 7(A) to 7(G), according to a drive operation combining the method related to FIGS. 5(A) to 5(G) and the method related to FIGS. 6(A) to 6(G), that is, the method of reducing the voltage to the negative potential through the ground level (0) when turning off the reset transistor 14 and the method of setting the timing of sampling and holding to the ground level, two further effects are simultaneously obtained.

Next, an example of the operation of the MOS type solid state imaging device according to the present embodiment having the above configuration will be explained. Here, an explanation will be given by focusing on the bottom left pixel in FIG. 2. The case of employing the method of controlling the gate voltage of the reset transistor 14 by the three values of the power source potential (for example 3V), the ground potential (0V), and the negative power source potential (for example −1V) will be explained as an example.

First, at the time of nonselection, the potential of the floating node N11 becomes 0.5V. At this time, a power supply voltage Vdd, for example 3.0V, is output as a reset voltage B1 from the V-shift register 25. The potential of the drain line 23 also becomes the power supply voltage Vdd.

The load signal given to the load line 28 is set at for example 1.0V, then the reset signal R1 of the H level is output from the V-shift register 25. Then, the reset transistor 14 becomes conductive, therefore the floating node N11 is connected to the drain line 23 through the reset transistor 14, and the potential thereof is reset to the H level determined by a channel voltage of the reset transistor 14, for example 2.5V. Due to this, the gate potential of the amplifier transistor 13 becomes 2.5V.

A potential Vsig1 of the vertical signal line 22 is determined by the highest gate voltage among those of the amplifier transistors of the plurality of pixels connected with the vertical signal line 22. As a result, the potential Vsig1 of the vertical signal line 22 is determined according to the potential of the floating node N11. Specifically, the amplifier transistor 13 forms a source follower together with the load transistor 27, and the output voltage thereof appears on the vertical signal line 22 as the pixel potential Vsig1. The potential Vsig1 at this time becomes the voltage of the reset level. The voltage of this reset level is input to the sample and hold/CDS circuit 31 through the sample and hold switch 29.

Next, the vertical selection pulse T1 output from the V-shift register 25 is raised to the H level. Then, the transfer transistor 12 becomes conductive, and the signal charge (electrons in the present example) converted and stored at the photodiode 11 are transferred (read out) to the floating node N11. Due to this, the gate potential of the amplifier transistor 13 changes to the negative direction in accordance with the amount of the signal charge read out from the photodiode 11 to the floating node Nil. The potential Vsig1 of the vertical signal line 22 changes in accordance with that.

The potential Vsig1 at this time becomes the voltage of the original signal level. The voltage of this signal level is input through the sample and hold switch 29 to the sample and hold/CDS circuit 31. Then, the sample and hold/CDS circuit 31 performs processing for taking the difference between the voltage at the previous reset level and the voltage of the signal level this time and holding this difference voltage.

Next, the reset voltage B1 output from the V-shift register 25 is set to 0V. At this time, a reset voltage B1' given to the pixel 10 through the drain line 23 is not 0V, but is determined by the channel voltage of the P-type MOS transistor and becomes for example 0.5V.

In that state, when the reset signal R1 of the H level is output from the V-shift register 25, the reset transistor 14 becomes conductive, therefore the floating node N11 is connected to the drain line 23 through the reset transistor 14, and the potential thereof becomes the potential of the drain line 23, that is 0.5V, and the pixel 10 returns to the nonselected state.

At this time, for the gate of the reset transistor 14, when turning the reset transistor 14 on→off through the reset line 24, the gate potential is not directly changed to the negative power source potential from the power source potential 3V, but is once held at the ground potential 0V from the power source potential, charged/discharged to the ground potential, then set at the negative power source potential, i.e., a potential −1V. Due to this, the potential difference required for draining the negative power source generation circuit becomes 1V, the amount of charging and discharging becomes small, and the load of the circuit is reduced.

In this nonselected state, the potential of the floating node N11 is not 0V, but 0.5V, therefore the leakage of electrons to the photodiode 11 through the transfer transistor 12 is prevented. Here, the potential of the floating node N11 becomes 0.5V because of the action of the P-type MOS transistor 26 connected between the reset voltage output end of the V-shift register 25 and the drain line 23.

All pixels in the first row are simultaneously driven by the above series of operations, and one row's worth of signals are simultaneously held (stored) in the sample and hold/CDS circuit 31. Thereafter, the period of the photoelectric conversion operation (exposure) at the photodiode 11 and the storage of photons is entered.

Then, in this photon storage period, the H shift register 34 starts the horizontal scan operation and sequentially outputs horizontal scanning pulses H1, H2, . . . . Due to this, the horizontal selection switches 33 sequentially become conductive and sequentially guide signals held in the sample and hold/CDS circuit 31 to the horizontal signal line 32.

When performing the same operation for pixels in the second row next, pixel signals of pixels in the second row are read out. By sequentially vertically scanning pixels next by the V-shift register 25, pixel signals of all rows can be read out. By sequentially horizontal scanning them by the H shift register 34 for each row, signals of all pixels can be read out.

As explained above, in the MOS type solid state imaging device having a three-transistor configuration in which each unit pixel 10 has a transfer transistor 12, an amplifier transistor 13, and a reset transistor 14, the gate voltage of the reset transistor 14 is controlled by the three values of the power source potential (for example 3V), the ground potential (0V), and the negative power source potential (for example −1V). Therefore, the noise from the nonselected row can be made small, and the occurrence of vertical stripes in a bright scene can be suppressed.

Further, there are the advantages that there is no longer a need for charging including the floating node capacity via the reset transistor, the increase of the driver size of the drain line can be prevented, and high speed operation can be secured.

Figure 8:
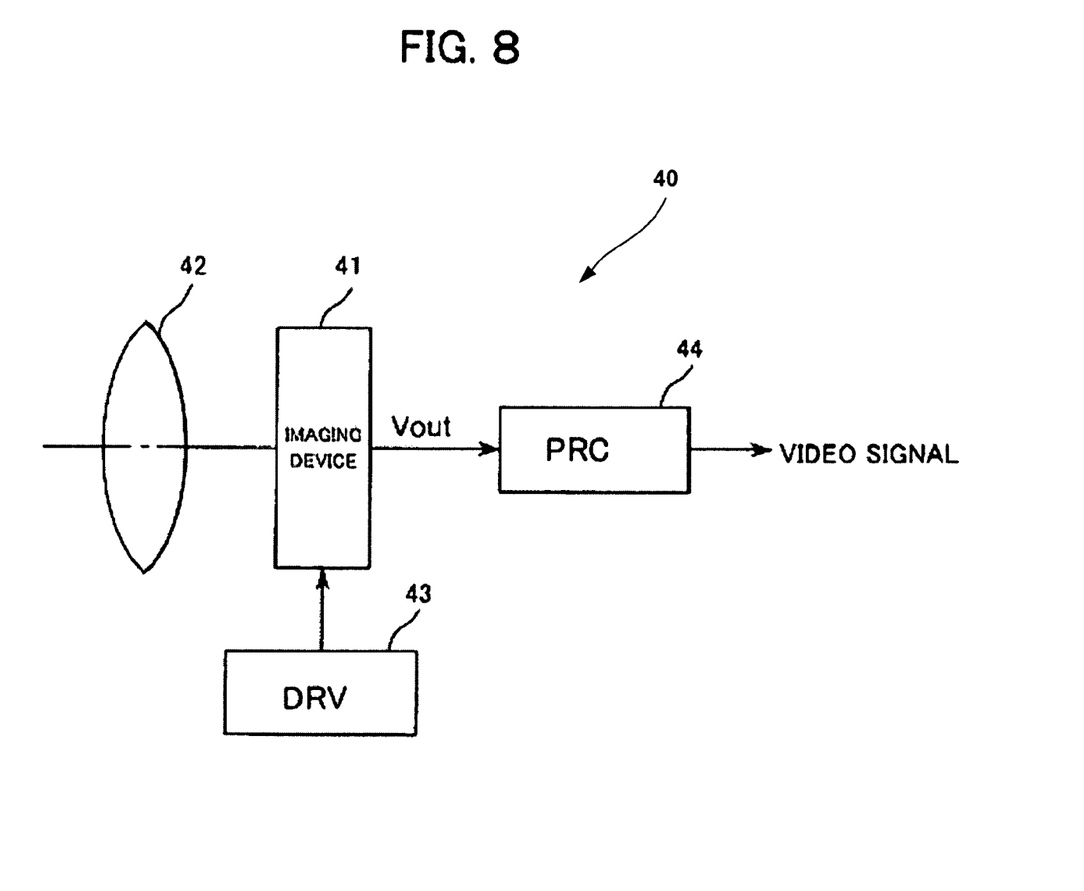
[FIG. 8] A block diagram showing an example of the configuration of a camera system according to the present invention.

FIG. 8 is a block diagram showing the schematic configuration of a camera system according to the present invention.

The camera system 40 has an imaging device 41, an optical system for guiding incident light to the pixel area of this imaging device 41, for example a lens 42 for focusing the incident light (imaging light) onto an imaging surface, a drive circuit 43 for driving the imaging device 41, a signal processing circuit 44 for processing the output signal of the imaging device 41, and so on.

In this camera system, as the imaging device 41, use is made of a solid state imaging device according to the above embodiment, that is, an MOS type solid state imaging device having a unit pixel 10 of a three-transistor configuration including a transfer transistor 12, an amplifier transistor 13, and a reset transistor 14 other than the photodiode 11, where at least one potential supplied to the gate electrode of the reset transistor is at least the negative potential or three or more types of potentials can be supplied to the gate electrode of the reset transistor.

The drive circuit 43 has a timing generator (not shown) for generating various types of timing signals including a start pulse and a clock pulse for driving the V-shift register 25 and the H shift register 34 in FIG. 2 and drives the imaging device (MOS type solid state imaging device) 41 in order to realize the drive operation explained in the previously explained example of operation. The signal processing circuit 44 applies various types of signal processing to the output signal Vout of the MOS type solid state imaging device 41 and outputs the result as the video signal.

In this way, according to the present camera system, by using the MOS type solid state imaging device according to the previously explained embodiment as the imaging device 41, the MOS type solid state imaging device can make the noise from the nonselected row small, can suppress the occurrence of the vertical stripes in the bright scene, does not have to perform charging including the floating node capacity via the reset transistor, can prevent the increase of the driver size of the drain line, and can secure high speed operation, therefore an image having a high quality with small noise can be obtained with a small circuit scale and a low power consumption.

Note that the solid state imaging device of the present invention may be a solid state imaging device formed as one chip or may be a solid state imaging device of a modular type formed as a set of a plurality of chips as well. In the case of a solid state imaging device formed as the set of a plurality of chips, it is formed by a sensor chip for the imaging, a signal processing chip for the digital signal processing, and other chips and sometimes further includes an optical system.

INDUSTRIAL APPLICABILITY

The present invention can make the noise from the nonselected row small, can suppress the occurrence of the vertical stripes in the bright scene, does not have to perform charging including the floating node capacity via the reset transistor, can prevent the increase of the driver size of the drain line, and can secure high speed operation, therefore can be applied to electronics apparatuses such as digital cameras and video cameras. effectual

The invention claimed is:

1. A solid state imaging device with a unit pixel having:
   a photoelectric converter for generating a charge in accordance with an amount of incident light;
   a transfer transistor for transferring a signal of the photoelectric converter to a floating node;
   an amplifier transistor for outputting a signal of the floating node to a signal line;
   a reset transistor for resetting the floating node, at least one of a plurality of potentials supplied to a gate electrode of the reset transistor being a negative potential; and
   a portion able to supply three or more types of potentials to the gate electrode of the reset transistor,
   wherein,
   the device has a portion able to set the gate potential when bringing the reset transistor from an On state to an OFF state at a negative power source potential after passing a ground level power source potential from a positive high level power source potential.

2. A solid state imaging device as set forth in claim 1, wherein at both timings of sampling and holding a precharge phase and a data phase, the gate potential of the reset transistor is set at the ground potential.

3. A solid state imaging device as set forth in claim 2, wherein in a period during which the gate potential of the reset transistor of the selected pixel is set at the ground potential, the gate potential of the reset transistor of the nonselected pixel is a negative potential.

4. A camera system having:
   a solid state imaging device with a unit pixel having a photoelectric converter for generating a charge in accordance with an amount of incident light,
   a transfer transistor for transferring a signal of the photoelectric converter to a floating node,
   an amplifier transistor for outputting a signal of the floating node to a signal line,
   a reset transistor for resetting the floating node, at least one of a plurality of potentials supplied to a gate electrode of the reset transistor being a negative potential; and
   a portion able to supply three or more types of potentials to the gate electrode of the reset transistor;
   an optical system for guiding an incident light to an imaging portion of the solid state imaging device; and
   a signal processing circuit for processing an output signal of the solid state imaging devices,
   wherein,
   the device has a portion able to set the gate potential when bringing the reset transistor from an On state to an OFF state at a negative power source potential after passing a ground level power source potential from a positive high level power source potential.

* * * * *